United States Patent [19]

Sekiba

[11] Patent Number: 4,542,401
[45] Date of Patent: Sep. 17, 1985

[54] SEMICONDUCTOR DEVICE WITH SPRAYED METAL LAYER

[75] Inventor: Toshinobu Sekiba, Kawasaki, Japan

[73] Assignee: Tokyo Shibaura Denki Kabushiki Kaisha, Kawasaki, Japan

[21] Appl. No.: 563,884

[22] Filed: Dec. 22, 1983

Related U.S. Application Data

[63] Continuation of Ser. No. 190,944, Sep. 26, 1982, abandoned.

[30] Foreign Application Priority Data

Apr. 3, 1979 [JP] Japan .................................. 54-39934

[51] Int. Cl.³ ...................... H01L 21/58; H01L 23/14
[52] U.S. Cl. ........................................ 357/71; 29/590; 228/123; 357/80; 357/81

[58] Field of Search ...................... 357/80, 81, 65, 67, 357/71; 29/589, 590; 228/123; 427/91, 99

[56] References Cited

U.S. PATENT DOCUMENTS 3,290,564 12/1966 Wolff ..................................... 357/80

Primary Examiner—James W. Davie
Attorney, Agent, or Firm—Finnegan, Henderson, Farabow, Garrett & Dunner

[57] ABSTRACT

A semiconductor device has a sprayed metal layer formed by a method such as plasma spraying on a metal substrate of a material such as aluminum, and a semiconductor element attached to the sprayed metal layer by soldering. A sprayed insulting layer may be interposed between the sprayed metal layer and the metal substrate for electrically insulating the element from the substrate.

3 Claims, 5 Drawing Figures

SEMICONDUCTOR DEVICE WITH SPRAYED METAL LAYER

This application is a continuation of application Ser. No. 190,944, filed Sept. 26, 1980, now abandoned.

The present invention relates to an improvement in a semiconductor device constituting a circuit, by soldering a semiconductor element on a metal substrate.

Semiconductor devices called modules or stacks are conventionally known which include one or more semiconductor elements, for example, diodes which are soldered on a metal substrate. The basic construction of such a semiconductor device is such that a semiconductor element such as a diode or transistor is secured, by soldering, at a predetermined position on a copper substrate which is a heat-discharging plate. However, a semiconductor device of such construction has been defective in that it is heavy in weight and expensive to manufacture, since the substrate is made of copper. Furthermore, since it is difficult to cast a copper substrate, formation of heat-discharging wings on the substrate for facilitating heat discharge from the semiconductor element is difficult. In order to eliminate such problems, a semiconductor device is known which uses an aluminum substrate which is light in weight, inexpensive to manufacture and easy to cast. As shown in FIG. 1, direct soldering on an aluminum surface is difficult, so that a metal layer 2 of copper, nickel or the like is formed on the surface of an aluminum substrate 1 by plating or hot pressing. A semiconductor device is manufactured by attaching a semiconductor element 4 by a solder layer 3 to the metal layer 2. However, the metal layer 2 is formed over the entire surface of the aluminum substrate 1, so that formation of the metal layer in a desired configuration corresponding to the shape of the semiconductor element is extremely difficult. Accordingly, the unnecessary part of the metal layer 2 must be removed by, for example, etching, causing problems with respect to the packing density of the semiconductor device. Furthermore, a considerable length of time is required for forming the metal layer 2 of a predetermined thickness by plating, causing more problems.

For electrical insulation between the semiconductor element and the metal substrate, an insulating layer of, for example, ceramic material must be interposed therebetween. However, since the soldering of an insulating layer of ceramic and so on is very difficult, several intermediate layers must be formed between the solder layer and the insulating layer. For example, as shown in FIG. 2, a solder layer 13a is formed on a metal layer 12 of copper, nickel or the like formed on the surface of an aluminum substrate 11. A nickel layer 15a and a molybdenum or tungsten layer 16a are formed thereover, in the order named, by plating, deposition or the like. An insulating layer 17 is formed on the layer 16a by deposition or the like, and a molybdenum or tungsten layer 16b and a nickel layer 15b are formed thereover. A semiconductor element 14 is attached through a solder layer 13b on the nickel layer 15b. In another method, an insulating plate of a ceramic formed by sintering is used. On both surfaces of the insulating plate are formed molybdenum or tungsten layers by a method such as metallizing. Metal layers of nickel, copper or the like are formed thereover. An insulating plate processed in this manner is attached by soldering to a copper substrate or a nickel substrate having a metal layer which allows soldering. The manufacture of a semiconductor device with a semiconductor element insulated from a metal substrate is extremely cumbersome, and the manufacturing efficiency is inferior.

Although an example of an aluminum substrate is shown in FIG. 2, a copper substrate is the same in that many intermediate layers must be formed for forming an insulating layer.

It is an object of the present invention to provide a semiconductor device which is easy to manufacture, compact in size, and which enables higher packing density.

It is another object of the present invention to provide a semiconductor device which has excellent ability to discharge heat from the semiconductor element to the metal substrate and in which the adhesion between the two is excellent.

It is still another object of the present invention to provide a semiconductor device which includes a semiconductor element attached to the metal substrate with an insulating layer therebetween, which is easy to manufacture, and which is excellent in adhesion and heat-discharging characteristics.

A semiconductor device according to the present invention includes a sprayed metal layer formed on at least part of the surface of a metal substrate, a solder layer formed on the sprayed metal layer and a semiconductor element securely fixed to the solder layer.

A semiconductor device of the present invention, in another aspect, includes a sprayed insulating layer formed on at least part of the surface of a metal substrate, a sprayed metal layer formed on the sprayed insulating layer, a solder layer formed on the sprayed metal layer, and a semiconductor element securely fixed to the solder layer.

According to the present invention, metal layers and insulating layers are formed by spraying on the desired parts of the surface of the metal substrate so that the manufacture of the semiconductor device is easy and efficient, and the obtained semiconductor device may be made small in size and may be packed with a higher packing density.

This invention can be more fully understood from the following detailed description when taken in conjunction with the accompanying drawings, in which.

Figure 4:
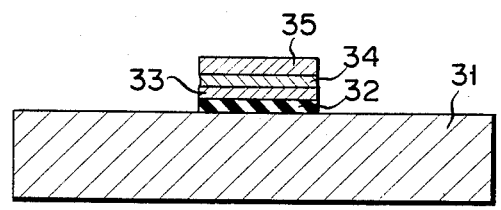
Figure 5:
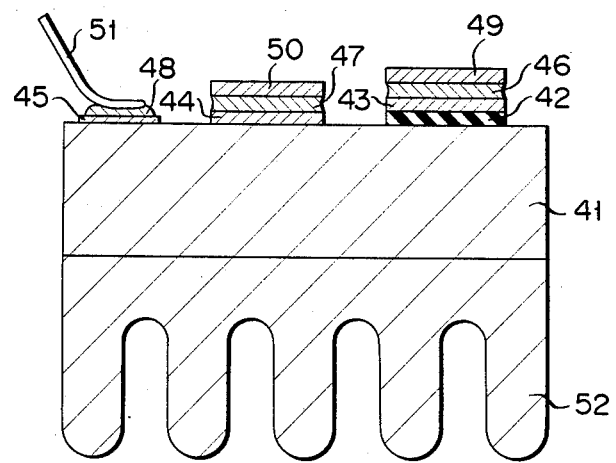

FIG. 4 is a sectional view of a semiconductor device in accordance with another embodiment of the present invention in which a sprayed insulating layer is interposed between the metal substrate and the semiconductor element; and FIG. 5 is a sectional view of a semiconductor device in accordance with still another embodiment of the present invention, which includes one semiconductor element attached to a metal substrate by a sprayed metal layer and another semiconductor element attached by a sprayed insulating layer and a sprayed metal layer.

Figure 3:
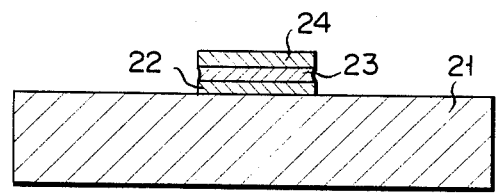
FIG. 3 is a sectional view of a semiconductor device in accordance with an embodiment of the present invention in which a semiconductor element is attached to the metal substrate by a sprayed metal layer.

In a semiconductor device as shown in FIG. 3, a sprayed metal layer 22 is formed by spraying on a predetermined part of the surface of a metal substrate 21, in a shape corresponding to that of a semiconductor element 24. A solder layer 23 of a general Sn-Pb based or Sn-based substance is formed on the sprayed metal layer 22, and the semiconductor element 24 such as a diode or transistor is securely fixed by this solder layer 23. In a semiconductor device of this construction, the semiconductor element 24 and the metal substrate 21 are rendered electrically conductive.

A semiconductor device with an electrically insulated semiconductor element from a metal substrate is shown in FIG. 4. A sprayed insulating layer 32 is formed in a shape corresponding to that of a semiconductor element 35, on a predetermined part of the surface of a metal substrate 31. A sprayed metal layer 33 is further formed thereover. A general solder layer 34 is formed on the sprayed metal layer 33, and the semiconductor element 35 is attached using this solder layer 34.

The substrate is made of metal such as aluminum and copper which are generally used. An aluminum substrate is preferable from the point of view of a lighter semiconductor device and ease in the casting of the substrate.

The sprayed metal layer is preferably copper, nickel, tin or silver, since they provide excellent adhesion between the solder layer and metal substrate and have excellent electrical and thermal conductivity. The sprayed insulating layer is made of an electrically insulating material, i.e. ceramics such as alumina, and plastics. Formation of the sprayed metal layer and the sprayed insulating layer may be performed by a known spraying technique. As spraying techniques, flame spraying utilizing a gas flame and arc spraying utilizing an electric arc and so on are known. However, plasma spraying is preferable which is capable of melting a material of a high melting point and providing high kinetic evergy. The spraying conditions such as the spraying distance, the current and the voltage for spraying may be suitably selected according to the kind of metals and the insulating material to be sprayed. For spraying the metals and insulating material, the part of the surface of the metal substrate other than the predetermined part to be sprayed on is masked, and the predetermined part is preferably matted in advance by methods such as sand blasting. The thickness of the sprayed metal layer, formed by spraying, is preferably in the range of 0.05–0.4 mm, and the thickness of the sprayed insulating layer is preferably in the range of 0.05–0.4 mm. The mean coarseness of the surface of the sprayed layer is preferably 10–100 $\mu$m for good adhesion with other layers.

FIG. 5 shows an embodiment of a semiconductor device for rectifying an AC current into a DC current. Referring to FIG. 5, an insulating layer 42 is formed by spraying on part of the surface of an aluminum substrate 41. A first sprayed metal layer 43 is formed over the sprayed insulating layer 42. A second sprayed metal layer 44 is formed on another part of the surface of the substrate 41. For connection with wiring 51 from the substrate 41, a third sprayed metal layer 45 may be simultaneously formed. General solder layers 46, 47 and 48 are respectively formed on the first, second and third sprayed metal layers 43, 44 and 45. Diode elements 49 and 50 are respectively adhered to the first and second solder layers 46 and 47 and the wiring 51 is connected to the third solder layer 48. Of the two semiconductor elements 49 and 50 attached to the same substrate 41, the element 49 is electrically insulated from the substrate 41 by the sprayed insulating layer 42. A heat-discharging wing 52 is formed on the substrate 41.

According to the present invention, semiconductor elements may be very easily attached, utilizing sprayed metal layers and sprayed insulating layers, to a substrate which is difficult to directly solder, such as an aluminum substrate. In particular, when formation of an insulating layer of, for example, ceramic is required, a semiconductor device may be manufactured with processes comprising drastically decreased steps in comparison with a conventional device as shown in FIG. 2.

Since the sprayed metal layers and the sprayed insulating layers may be formed on parts of the surface of a metal substrate in shapes corresponding to the shapes of the semiconductor elements to be attached, the semiconductor device may be made compact in size and packed with higher density.

With the semiconductor device of the present invention, the adhesion of the semiconductor element to the metal substrate may be improved. This is attributed to the fact that the sprayed metal layers and the sprayed insulating layers are securely attached to the metal substrate, and the solder layer is securely fixed to the surface of the respective sprayed layers which is matted and having fine holes. Although adhesion between insulating layers and metals is not good in general, the sprayed insulating layers of the present invention adhere strongly to the metal substrate and the solder layer.

Figure 1:
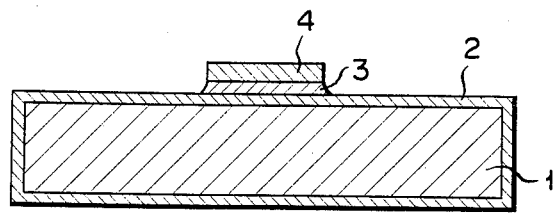
FIG. 1 is a sectional view of a conventional semiconductor device with a semiconductor element attached to a metal substrate.
Figure 2:
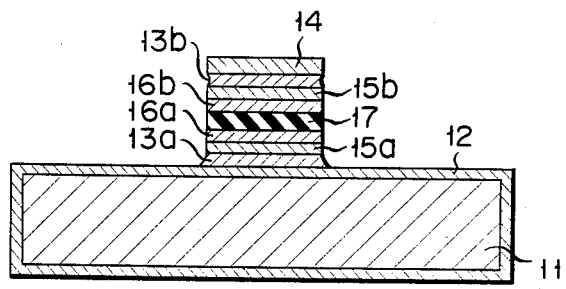
FIG. 2 is a sectional view of a conventional semiconductor device with an insulating layer interposed between the metal substrate and the semiconductor element.

Surprisingly, the heat-discharging characteristics are vastly improved with the semiconductor device including a sprayed insulating layer as shown in FIG. 4, in comparison with a conventional device including a insulating layer as shown in FIG. 2. With a semiconductor device as in FIG. 2 of the same dimensions as the semiconductor device shown in FIG. 4 having an sprayed alumina insulating layer 30 mm in width and 30 mm in length on a metal substrate 45 mm in width and 36 mm in length, the temperature of the semiconductor element was measured after operation for an hour at 50 W. The temperature difference between the semiconductor element and the metal substrate was 15° C. with the conventional device, and it was 5° C. with the device of the present invention.

What is claimed is:

1. A semiconductor device with a semiconductor element soldered to a metal substrate, comprising:
   a sprayed insulating layer which is directly attached to a predetermined part of the surface of said metal substrate and which consists of ceramics or plastics, the thickness of the sprayed insulating layer being from 0.05 to 0.4 mm;
   a sprayed metal layer which is directly attached to said sprayed insulating layer and which consists of one metal selected from the group consisting of copper, nickel, tin and silver; and
   a solder layer directly attached to said sprayed metal layer for securely attaching said semiconductor element.

2. A semiconductor device having at least two semiconductor elements soldered to a metal substrate, comprising:
   a first semiconductor element soldered to the metal substrate by means of layers consisting essentially of a sprayed insulating layer, a first sprayed metal layer and a first solder layer, said sprayed insulating layer being directly attached to a predetermined part of the surface of said metal substrate, consisting of ceramics or plastics, and having a thickness of 0.05 to 0.4 mm, said first sprayed metal layer being directly attached to said sprayed insulating layer and consisting of one metal selected from the group consisting of copper, nickel, tin and silver, and said solder layer being directly attached to said sprayed metal layer for securely attaching said first semiconductor element; and a second semiconductor element soldered to the metal substrate by means of layers consisting essentially of a second sprayed metal layer and a second solder layer directly attached to said second sprayed metal layer for securely attaching said second semiconductor element, said second sprayed metal layer being directly attached to a predetermined part of the surface of said metal substrate and consisting of one metal selected from the group consisting of copper, nickel, tin and silver.

3. A semiconductor device according to claim 1 or 2, wherein the metal substrate is made of aluminum.

* * * * *

UNITED STATES PATENT AND TRADEMARK OFFICE
CERTIFICATE OF CORRECTION

PATENT NO. : 4,542,401
DATED : September 17, 1985
INVENTOR(S) : Toshinobu SEKIBA It is certified that error appears in the above-identified patent and that said Letters Patent is hereby corrected as shown below:

On the title page:

In the section entitled "Related U.S. Application Data", "Continuation of Ser. No. 190,944, Sep. 26, 1982," should read --Continuation of Ser. No. 190,944, Sep. 26, 1980--.

Omit the section entitled "Foreign Application Priority Data".

Signed and Sealed this

Twenty-seventh Day of May 1986

[SEAL]

Attest:

DONALD J. QUIGG

Attesting Officer

Commissioner of Patents and Trademarks